United States Patent [19]
Watanabe et al.

[11] Patent Number: 5,151,845
[45] Date of Patent: Sep. 29, 1992

[54] ELECTROSTATIC CHUCK

[75] Inventors: Toshiya Watanabe; Tetsuo Kitabayashi, both of Kanagawa, Japan

[73] Assignee: Toto Ltd., Fukuoka, Japan

[21] Appl. No.: 774,641

[22] Filed: Oct. 11, 1991

Related U.S. Application Data

[63] Continuation of Ser. No. 408,699, Sep. 18, 1989, abandoned.

[30] Foreign Application Priority Data

Sep. 19, 1988 [JP] Japan ................ 63-234505

[51] Int. Cl.⁵ ............................................. H02N 13/00
[52] U.S. Cl. ..................................... 361/234; 279/128
[58] Field of Search ................. 279/1 R, 1 M; 269/8, 269/903; 361/234, 230, 233

[56] References Cited

U.S. PATENT DOCUMENTS 4,692,836 9/1987 Suzuki ................... 361/234

FOREIGN PATENT DOCUMENTS 2520930 8/1983 France .
62-286248 12/1987 Japan .
62-286249 12/1987 Japan .
1043298 9/1966 United Kingdom ............... 361/234

Primary Examiner—Larry I. Schwartz
Assistant Examiner—Robert Schultz
Attorney, Agent, or Firm—Merchant, Gould, Smith, Edell, Welter & Schmidt

[57] ABSTRACT

An electrostatic chuck for electrostatically attracting and holding an object such as a semiconductor wafer includes a base plate, at least two layers each including an electrically insulating film and an electrode attached to a lower surface thereof, the at least two layers being disposed as attractive layers on the base plate, and a voltage applying assembly for selectively applying a voltage to at least one of the electrodes to electrostatically attract the object to the insulating film of an uppermost one of the layers. The insulating films may have different insulation resistances to allow for a wider range of temperature changes.

12 Claims, 3 Drawing Sheets 6,151,845

ELECTROSTATIC CHUCK

This is a continuation of application Ser. No. 07/408,699 filed Sep. 18, 1989 and now abandoned.

BACKGROUND OF THE INVENTION

1. Field of the Invention

The present invention relates to an electrostatic chuck for electrostatically attracting and securely holding an object such as a semiconductor wafer.

2. Description of the Relevant Art

Recent years have seen the use of an electrostatic chuck as a jig for firmly holding a semiconductor wafer while the semiconductor wafer is being processed at very small dimensions, e.g., while it is being patterned.

For example, Japanese Patent Publication No. 60(1985)-59104 discloses an electrostatic chuck including an electrode plate having one surface on which an electrically insulating dielectric layer of alumina or the like is deposited by flame spraying. An object such as a semiconductor wafer is placed on the dielectric layer, and a voltage is applied across the dielectric layer between the wafer and the electrode plate for holding the wafer on the dielectric layer.

With the conventional electrostatic chuck, the dielectric layer has a large volume resistivity $\rho$ of about $10^{14}$ $\Omega$·cm, and almost no electric charges move in the dielectric layer. The wafer is attracted by an electrostatic force developed between the electrode plate to which the voltage is applied and the object itself. However, the electrostatic force thus produced is small and does not sufficiently attract the object.

SUMMARY OF THE INVENTION

In view of the foregoing shortcoming of the conventional electrostatic chuck, it is an object of the present invention to provide an electrostatic chuck which is capable of attracting and holding an object such as a semiconductor wafer under a large electrostatic force that remains stable at all times.

According to the present invention, the volume resistivities $\rho$ of electrically insulating films are selected to be about $10^{11}$ $\Omega$·cm to permit electric charges to move in the electrically insulating films. By selectively applying a voltage to the electrically insulating films, volume charges are produced in the surface of the electrically insulating film which is positioned adjacent to an object to be attracted, so that a large electrostatic force can effectively be generated between the volume charges and the object.

If the insulating films are made of ceramic, then since the ceramic has its insulation resistance or volume resistivity decreasing as the temperature thereof increases, the volume resistivity thereof tends to be lower than the above value, resulting in a larger leakage current in excess of a power supply capability. When this happens, a suitable voltage may not be applied, and the electrostatic chuck can operate effectively only in a very small temperature range. To eliminate the above drawback, the electrostatic chuck according to the present invention is arranged to produce a large stable electrostatic force in a wide temperature range.

Therefore, in accordance with the present invention, there is provided an electrostatic chuck for electrostatically attracting and holding an object, comprising a base plate, at least two layers each including an electrically insulating film and an electrode attached to a lower surface thereof, the at least two layers being disposed as attractive layers on the base plate, and voltage applying means for selectively applying a voltage to at least one of the electrodes to electrostatically attract the object to the insulating film of an uppermost one of the layers. The insulating films may have different insulation resistances to allow for a wider range of temperature changes.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
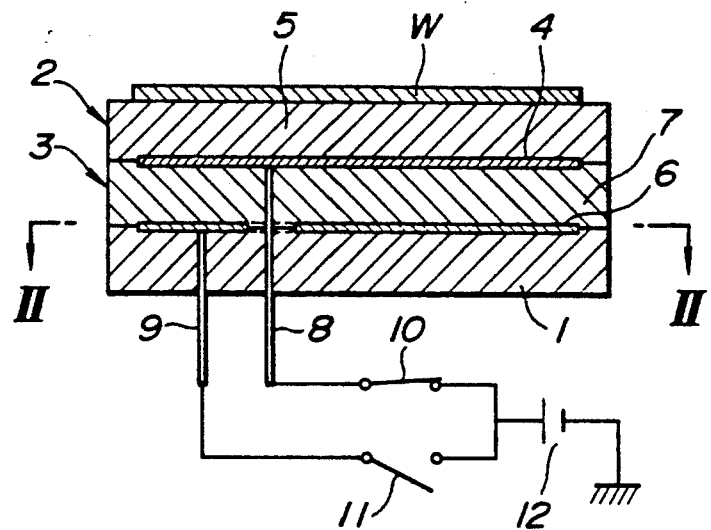
FIG. 1 is a vertical cross-sectional view of an electrostatic chuck according to an embodiment of the present invention, the view showing the layer structure of the FIG. 2 is a cross-sectional view taken along line II—II of the electrostatic chuck shown in FIG. 1.
Figure 2:
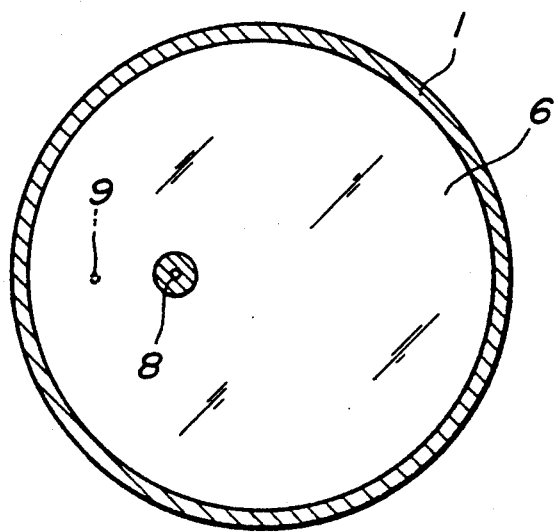

As shown in FIGS. 1 and 2, an electrostatic chuck according to an embodiment of the present invention comprises a circular base plate 1, a first layer 2 disposed on the circular base plate 1, and a second layer 3 disposed on the first layer 2. The first layer 2 comprises a first electrode 4 and a first electrically insulating film 5, and the second layer 3 comprises a second electrode 6 and a second electrically insulating film 7. The first and second electrodes 4, 6 comprise electrode films attached to the lower surfaces of the first and second electrically insulating films 5, 7, respectively, in substantially fully covering relation thereto.

The base plate 1 is made of Al$_2$O$_3$, Si$_3$N$_4$, AlN, SiC, or the like. The first and second electrodes 4, 6 are made of Ag/Pd or the like, and the first and second insulating films 5, 7 are made of Al$_2$O$_3$ with TiO$_2$ added. The electrostatic chuck is fabricated by pressing a plurality of green sheets (two green sheets in this embodiment) in the form of pastes with the electrode films printed thereon, against a ceramic green sheet serving as the base plate 1, and then firing the laminated body.

Figure 3:
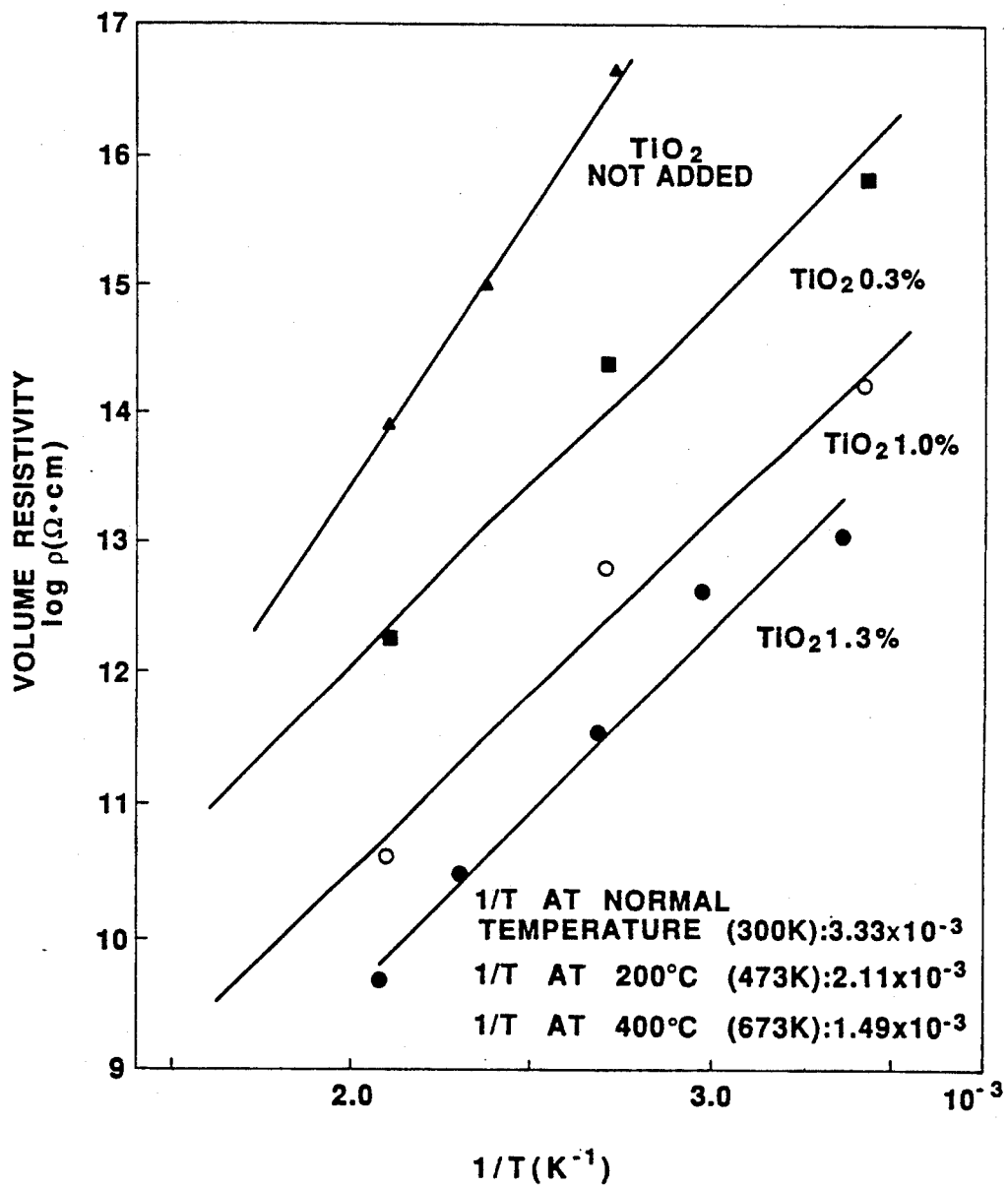
FIG. 3 is a graph showing the relationship between a volume resistivity as it varies depending on the temperature of electrically insulating films in the electrostatic chuck and the amount of TiO$_2$ added.

Each of the first and second insulating films 5, 7 has a thickness of about 300 μm, but they have different insulation resistances. More specifically, as shown in FIG. 3, the volume resistivity $\rho$ of the first insulating film 5 is selected to range from $10^{11}$ to $10^{12}$ $\Omega$·cm in a temperature range from normal temperature to 200° C. by adding 1.0 wt. % of TiO$_2$. The volume resistivity $\rho$ of the second insulating film 7 is selected to range from $10^{11}$ to $10^{12}$ $\Omega$·cm in a temperature range from 200° C. to 400° C. by adding 0.3 wt. % of TiO$_2$. The insulation resistance R and the volume resistivity $\rho$ are related to each other as follows:

$$R = \rho \cdot l / S$$

where l is the distance to be insulated and S is the area to be insulated.

The first and second electrodes 4, 6 are electrically connected to a power supply 12 through respective terminals 8, 9 and respective switches 10, 11. The power supply 12, the terminals 8, 9, and the switches 10, 11 jointly serve as a voltage applying means.

To attract a semiconductor wafer W to the electrostatic chuck as a flat support at a low temperature (ranging from normal temperature to 200° C.), the switch 10 is turned on and the switch 11 is turned off to apply a voltage to the first electrode 4 so that only the first insulating film 5 is used as a dielectric film or an attracting layer. Since the volume resistivity $\rho$ of the first insulating film 5 at this time is in the range of from $10^{11}$ to $10^{12}$ $\Omega$·cm, as described above, a large attractive force is developed by volume charges which exist on the upper surface of the insulating film 5. When the temperature ranges from 200° C. to 400° C., the switch 10 is turned off and the switch 11 is turned on to apply the voltage to the second electrode 6 so that the first and second insulating films 5, 7 are used as dielectric films or attractive layers. At this time, a sufficient attractive force is developed because the volume resistivity $\rho$ of the principal dielectric film (i.e., the second insulating film 7) ranges from $10^{11}$ to $10^{12}$ $\Omega$·cm.

Even if the first and second insulating films 5, 7 have the same volume resistivity $\rho$, the combined volume resistivity of the dielectric films may be kept in a constant range by selectively switching on and off the electrodes even when the temperature changes. However, the different volume resistivities of the insulating films 5, 7 allow for a wider range of temperature changes.

Figure 4:
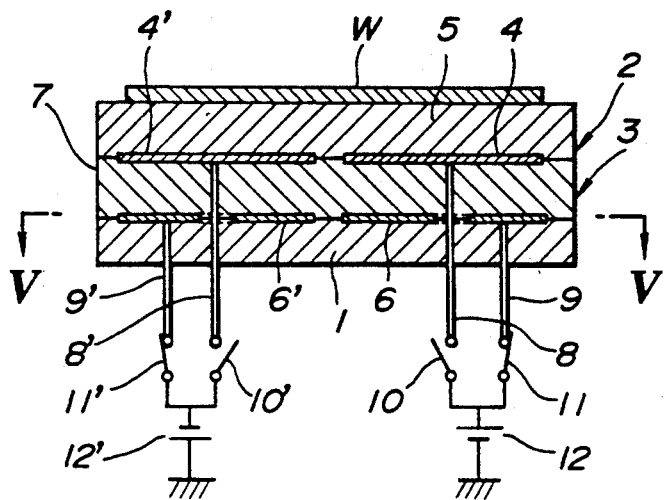
FIG. 4 is a vertical cross-sectional view of an electrostatic chuck according to a modification of the present invention.
Figure 5:
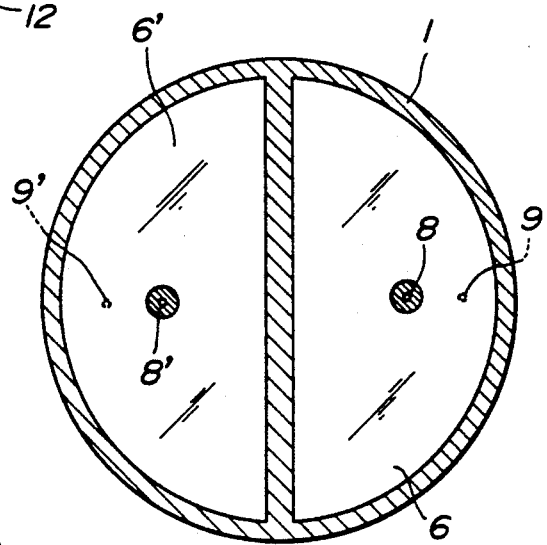
FIG. 5 is a cross-sectional view taken along line V—V of FIG. 4.

FIGS. 4 and 5 illustrate a modified electrostatic chuck according to the present invention. The modified electrostatic chuck includes a pair of semicircular electrodes 4, 4' spaced from each other, a pair of semicircular electrodes 6, 6', and first and second insulating films 5, 7 having different volume resistivities. The semicircular electrodes 4, 4' and 6, 6' are attached to and extend in substantially fully covering relation to the lower surfaces of the first and second insulating films 5, 7, respectively. As shown in FIG. 4, it is possible to apply voltages of opposite polarities to paired electrodes (e.g., a positive voltage to the electrode 4 or 6 and a negative voltage to the electrode 4' or 6').

With this modification, the volume resistivity of the dielectric films can be kept in a substantially constant range by selectively turning on and off switches 10, 10', 11, 11' regardless of whether the temperature is low or high. The electrodes are not limited to the semicircular shape, but may be of any of various other shapes depending on the intended application of the electrostatic device.

In the above embodiment and modification, the two layers each comprising an insulating film and an electrode are disposed on the base plate 1. However, three or more layers may be disposed on the base plate 1. Moreover, the electrodes and insulating films may be fabricated by printing, plasma flame spraying, etching, evaporation, or the like, rather than the green sheet lamination.

Figure 6:
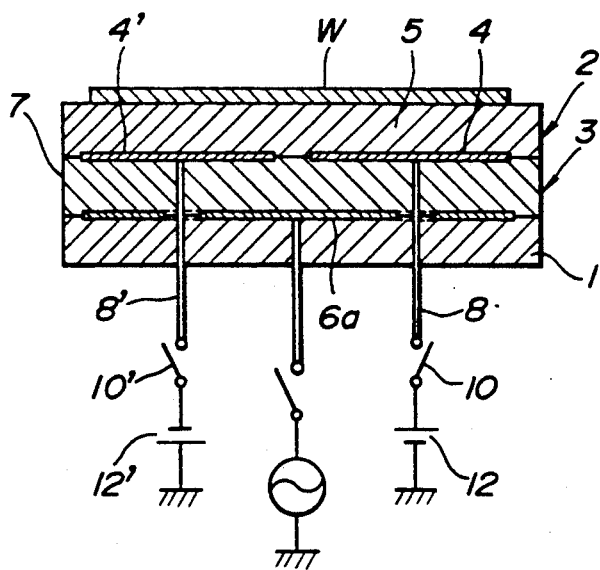
FIG. 6 is a vertical cross-sectional view of an electrostatic chuck according to another modification of the present invention.

To process a semiconductor wafer electrostatically attracted and firmly held by the electrostatic chuck in a plasma etching process, it is possible to apply a DC voltage to one of the embedded electrodes and to apply a highfrequency AC voltage to the other embedded electrode for highly accurately controlling the ion energy for increased etching controllability. Such a procedure may be achieved by still another modification shown in FIG. 6. As shown in FIG. 6, a second electrode 6a is a single electrode as is the case with the embodiment shown in FIG. 2, rather than the two electrodes 6, 6' illustrated in FIGS. 4 and 5, and a high-frequency voltage is applied to the second electrode 6a. Three or more layers each comprising an insulating film and an electrode may be disposed on the base plate by adding a set of electrodes to which a high-frequency voltage is applicable.

With the present invention, as described above, the insulating films having respective volume resistivities are successively disposed on the base plate, and a voltage is selectively applied to electrodes attached to the insulating films depending on the temperature at which the electrostatic chuck is used. The electrostatic chuck can develop a high attractive force which is stable at all times within a wide temperature range without being subjected to current leakage.

Although there have been described what are at present considered to be the preferred embodiments of the present invention, it will be understood that the invention may be embodied in other specific forms without departing from the essential characteristics thereof. The present embodiments are therefore to be considered in all aspects as illustrative, and not restrictive. The scope of the invention is indicated by the appended claims rather than by the foregoing description.

We claim:

1. An electrostatic chuck for electrostatically attracting and holding an object, comprising:
    a base plate;
    at least two attractive layers located on said base plate, each attractive layer including an electrically insulating film of a temperature-dependent electrically insulating material with an upper surface and a lower surface and at least one electrode pattern attached to the lower surface, said at least two attractive layers being stacked one on another so that an uppermost one of said at least two stacked attractive layers provides support for an object to be electrostatically attracted; and
    voltage applying means for selectively and individually applying a voltage to the respective electrode patterns so that the voltage can be applied to any one of said electrode patterns depending on a temperature at which the electrostatic chuck is used, thereby to provide a stable electrostatic force to electrostatically attract the object located on the insulating film of the uppermost one of said stacked attractive layers.

2. An electrostatic chuck according to claim 1, wherein said electrically insulating films have different insulation resistances.

3. An electrostatic chuck according to claim 2, wherein said electrically insulating films are made of alumina and said different insulation resistances are achieved by adding different amounts of titanium oxide to said electrically insulating films, respectively.

4. An electrostatic chuck according to claim 1, wherein each of said electrode patterns comprises a single electrode film covering substantially the entire lower surface of one of said electrically insulating films.

5. An electrostatic chuck according to claim 1, wherein each of said electrode patterns comprises a plurality of electrode films of a desired shape covering substantially the entire lower surface of one of said electrically insulating films.

6. An electrostatic chuck according to claim 1, wherein said electrically insulating films are made of alumina contain different amounts of titanium oxide which are progressively larger toward the uppermost layer so that upper electrically insulating films have lower volume resistivities.

7. An electrostatic chuck according to claim 6, wherein each of said electrically insulating film possesses a volume resistivity which decreases as the temperature at which the electrostatic chuck is used increases, and wherein the voltage is applied to the electrode pattern of an upper one of said layers by said voltage applying means in a normal temperature range and to the electrode pattern of a lower one of said layers by said voltage applying means in a higher temperature range so that the average volume resistivity of the electrically insulating films for attracting the object ranges from $10^{11}$ to $10^{12}$ $\Omega \cdot cm$.

8. An electrostatic chuck according to claim 1, wherein said voltage applying means comprises means for applying a DC voltage to at least one of said electrodes and applying an AC voltage to another of said electrodes when the object which is electrostatically attracted and held is processed by plasma etching.

9. An electrostatic chuck for electrostatically attracting and holding a semiconductor object on a flat support, comprising:
   a base plate;
   at least two layers comprising an uppermost layer and at least one lower layer, each of said layers including an electrically insulating film with an upper surface and a lower surface, said film having an electric resistivity which decreases as the temperature at which the electrostatic chuck is used increases, and an electrode attached to the lower surface of the electrically insulating film, said at least two layers being formed in a stacked relation to one another as attractive layers located on said base plate; and
   voltage applying means for selectively and individually applying a voltage to the respective electrodes so that voltage can be applied to the electrode of a lower one of said layers as said temperature increases, thereby to move electric charges onto an upper surface of the electrically insulating film of an uppermost one of said layers and electrostatically attract the object to said upper surface.

10. An electrostatic chuck for electrostatically attracting and holding a semiconductor object on a flat support, comprising:
    a base plate;
    an upper attractive layer, said upper attractive layer comprising:
      a first electrically insulating layer having an upper surface and a lower surface; and
      a first electrode attached to the lower surface of said first electrically insulating layer;
    a lower attractive layer placed between said upper attractive layer and said base plate, said lower attractive layer comprising:
      a second electrically insulating layer having an upper surface and a lower surface; and
      a second electrode surface to the lower surface of said second electrically insulating layer; and
    voltage applying means comprising first selecting means for selectively and individually applying a first voltage to any one of said electrodes in order to generate an electrostatic force at the upper surface of said first insulating layer as a function of the volume resistivity of the insulating layers between the selected electrode and the upper surface of said first insulating layer.

11. An electrostatic chuck according to claim 10:
    wherein said upper attractive layer further comprises a third electrode attached to the lower surface of said upper electrically insulating layer;
    wherein said lower attractive layer further comprises a fourth electrode attached to the lower surface of said second electrically insulating layer; and
    wherein said voltage applying means further comprises second selecting means for selectively and individually applying a second voltage to any one of said third and fourth electrodes in order to generate an electrostatic force at the upper surface of said first insulating layer as a function of the volume resistivity of the insulating layers between the selected electrodes and the upper surface of said first insulating layer.

12. An electrostatic chuck for accurate control of an ion etch, comprising:
    a base plate;
    an upper attractive layer, said upper attractive layer comprising:
      a first electrically insulating layer having an upper surface and a lower surface; and
      a first electrode attached to the lower surface of said first electrically insulating layer;
    a lower attractive layer placed between said upper attractive layer and said base plate, said lower attractive layer comprising:
      a second electrically insulating layer having an upper surface and a lower surface; and
      a second electrode attached to the lower surface of said second electrically insulating layer;
    first selecting means for selectively applying a first voltage to said first electrode in order to generate an electrostatic force at the upper surface of said first insulating layer as a function of the volume resistivity of the first insulating layer; and
    second selecting means for selectively applying a second voltage to said second electrode in order to generate an electrostatic force at the upper surface of said first insulating layer as a function of the volume resistivity of the first and second insulating layers.

* * * * *

UNITED STATES PATENT AND TRADEMARK OFFICE
CERTIFICATE OF CORRECTION

PATENT NO. : 5,151,845
DATED : September 29, 1992
INVENTOR(S) : Watanabe et al

It is certified that error appears in the above-indentified patent and that said Letters Patent is hereby corrected as shown below:

Column 2, line 18, after "the" (third occurence) insert --electrostatic chuck;--.

Column 3, lines 18-19, change "$10^1_1$," to --$10^{11}$--.

Column 5, line 8 (claim 6, line 3), after "alumina" insert --and--.

Column 6, line 8 (claim 10, line 16), delete "surface" (first occurence), and insert --attached--.

Signed and Sealed this

First Day of February, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,151,845
DATED : September 29, 1992
INVENTOR(S) : Watanabe et al.

It is certified that error appears in the above-indentified patent and that said Letters Patent is hereby corrected as shown below:

On the title page, under "FOREIGN PATENT DOCUMENTS", please add the following two references:

60-59104    12/85    Japan
        0074691    09/82    Europe (EPO)

Signed and Sealed this

Fourteenth Day of June, 1994

Attest:

BRUCE LEHMAN

*Attesting Officer*      *Commissioner of Patents and Trademarks*